United States Patent
Tokuhiro et al.

(10) Patent No.: US 9,558,798 B2
(45) Date of Patent: Jan. 31, 2017

(54) RECEIVING CIRCUIT, MEMORY INTERFACE CIRCUIT, AND RECEIVING METHOD

(71) Applicant: FUJITSU LIMITED, Kawasaki-shi, Kanagawa (JP)

(72) Inventors: Noriyuki Tokuhiro, Kawasaki (JP); Ryo Mizutani, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/878,310

(22) Filed: Oct. 8, 2015

(65) Prior Publication Data
US 2016/0148663 A1    May 26, 2016

(30) Foreign Application Priority Data
Nov. 25, 2014    (JP) .................................. 2014-238013

(51) Int. Cl.
*G11C 5/14* (2006.01)
*G11C 7/22* (2006.01)
*G11C 7/10* (2006.01)

(52) U.S. Cl.
CPC ............. *G11C 7/222* (2013.01); *G11C 7/1093* (2013.01)

(58) Field of Classification Search
CPC .................................. G11C 5/14; G11C 7/22
USPC ............................................. 365/189.07, 226
See application file for complete search history.

(56) References Cited

U.S. PATENT DOCUMENTS

| | | | | |
|---|---|---|---|---|
| 6,591,319 B2* | 7/2003 | Kurd | ..................... | H03K 5/1252 327/379 |
| 6,700,438 B2* | 3/2004 | Chang | ..................... | H03K 5/082 327/562 |
| 6,753,701 B2* | 6/2004 | Chang | .................. | G11C 7/1084 326/29 |
| 6,898,724 B2* | 5/2005 | Chang | ................. | G06F 13/4072 330/252 |
| 7,227,396 B2* | 6/2007 | Minzoni | .................. | G11C 7/22 327/165 |
| 8,630,131 B1* | 1/2014 | Shiao | ....................... | G11C 5/04 326/30 |
| 2012/0250423 A1* | 10/2012 | Koyanagi | ...... | H03K 19/017527 365/189.05 |
| 2013/0010546 A1* | 1/2013 | Wang | ...................... | G11C 7/02 365/189.07 |

(Continued)

FOREIGN PATENT DOCUMENTS

JP    2000-115259    4/2000

*Primary Examiner* — Michael Tran
(74) *Attorney, Agent, or Firm* — Staas & Halsey LLP (57) ABSTRACT

A receiving circuit that receives differential data strobe signals between a controller and a memory, the receiving circuit includes: a first receiver that compares one of the differential data strobe signals to the other, output a high logic value when the one of the differential data strobe signals is higher than the other, and output a low logic value when the one is lower than the other; a second receiver that compares one of the differential data strobe signals to a strobe reference voltage, output a high logic value when the one of the differential data strobe signals is higher than the strobe reference voltage, and output a low logic value when the one of the differential data strobe signals is lower than the strobe reference voltage; and a determination circuit that outputs a logical OR of an output of the first receiver and an output of the second receiver.

11 Claims, 11 Drawing Sheets

(56) References Cited

U.S. PATENT DOCUMENTS

| | | | |
|---|---|---|---|
| 2013/0202061 A1* | 8/2013 | Chandrasekaran | H04L 25/06 375/317 |
| 2013/0290766 A1* | 10/2013 | Nguyen | G06F 1/12 713/400 |
| 2015/0092510 A1* | 4/2015 | Yildirim | G11C 8/06 365/233.13 |

* cited by examiner

FIG. 4A DURING WRITING (CONTROLLER TO MEMORY)

FIG. 4B DURING READING (MEMORY TO CONTROLLER)

| DQS | C | Y |
|---|---|---|
| DQS_t > DQS_c | 0 | H |
| DQS_t < DQS_c | 0 | L |
| DQS_t = DQS_c | 0 | UNDEFINED |
| Don't Care | 1 | H |

RECEIVING CIRCUIT, MEMORY INTERFACE CIRCUIT, AND RECEIVING METHOD

CROSS-REFERENCE TO RELATED APPLICATION

This application is based upon and claims the benefit of priority of the prior Japanese Patent Application No. 2014-238013, filed on Nov. 25, 2014, the entire contents of which are incorporated herein by reference.

FIELD

The embodiment discussed herein is related to a receiving circuit, a memory interface circuit, and a receiving method.

BACKGROUND

Double data rate (DDR) is a standard for connecting between a CPU (controller) and an external memory (dual inline memory module (DIMM)), and the DDR4 standard has been established in accordance with an increase in operation speed.

In DDR4, it has been decided that an interface called Pseudo Open Drain (POD) is employed as an interface technology for data transmission. The POD interface has a form in which a terminal resistor is connected between a signal terminal and a power source for a CMOS output. Thus, an output voltage (an input voltage) becomes a High (H) potential equal to a power source voltage (VDDQ), or a Low (L) potential equal to a voltage that is obtained by dividing VDDQ by a ratio of the terminal resistance and an output impedance of an output buffer.

In order for a controller to perform writing and reading of data to and from a memory, data strobe signals called DQS and data signal called DQ are transmitted and received between the controller and a DIMM. When data is written to the memory (during a write operation), data strobe signals and a data signal are transmitted from the controller to the DIMM. When data is read from the memory (during a read operation), data strobe signals and a data signal are transmitted from the DIMM to the controller. In addition to the data strobe signals and the data signal, address signals and command signals by which the controller specifies an operation (write/read) to/from the memory are provided, and these signals are uni-directionally transmitted from the controller to the DIMM.

The data strobe signals (DQS) are differential signals and include normal phase DQS_t and inverted phase DQS_c. The logic levels of DQS_t and DQS_c outputted from a DQS driver (an output circuit) of the controller and the DIMM are signals inverted with respect to each other at all times, and the logic values thereof are determined by the relative potentials of DQS_t and DQS_c. Specifically, a condition of DQS_t>DQS_c results in "H", a condition of DQS_t<DQS_c results in "L", and a condition of DQS_t=DQS_c results in an undefined state. The undefined state refers to "H", "L", or a state between both.

The data signal (DQ) is single-ended, and determination of the logic value thereof depends on a potential relative to a common voltage.

During a write operation and/or a read operation, the receiving side of the data signal (the memory during the write operation, and the controller for the read operation) utilizes the data strobe signals (DQS) as a timing reference for the data signal (DQ) to receive data. Therefore, the received data strobe signals (DQS) are supplied to a circuit that acquires the data signal (DQ) and, a situation where the data signal (DQ) is not acquired may occur when there is a large delay in a receiving circuit that receives the data strobe signals (DQS). DDR4 is a high-speed memory interface, and a delay is thus desired to be small in the receiving circuit that receives the data strobe signals (DQS).

When writing and reading to and from the memory are not performed, the controller and the DIMM output neither data strobe signals (DQS) nor data signal (DQ). Therefore, in DDR4, both data strobe signals (DQS) and data signal (DQ) become "H" due to the terminal resistor. In particular, because both DQS_t and DQS_c become "H", the logic value of the data strobe signals (DQS) is not defined, that is, becomes undefined. In an undefined state of the data strobe signals (DQS), malfunction is likely to occur when the data signal (DQ) is acquired and transferred inside due to noise and the like.

In a high-speed memory interface circuit, it is desirable that there be no such malfunction in which a data signal transmitted in synchronization with differential data strobe signals (DQS) is erroneously acquired.

The following is a reference document.
[Document 1] Japanese Laid-open Patent Publication No. 2000-115259.

SUMMARY

According to an aspect of the invention, a receiving circuit that receives differential data strobe signals between a controller and a memory, the receiving circuit includes: a first receiver that compares one of the differential data strobe signals to the other, output a high logic value when the one of the differential data strobe signals is higher than the other, output a low logic value when the one is lower than the other, and output a value that is different from the high logic value or the low logic value when the one of the differential data strobe signals is equal to the other; a second receiver that compares one of the differential data strobe signals to a strobe reference voltage, output a high logic value when the one of the differential data strobe signals is higher than the strobe reference voltage, output a low logic value when the one of the differential data strobe signals is lower than the strobe reference voltage, and output a value that is different from the high logic value or the low logic value when the one of the differential data strobe signals is equal to the strobe reference voltage; and a determination circuit that outputs a logical OR of an output of the first receiver and an output of the second receiver.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are diagrams illustrating circuit examples in which a driver (an output buffer) is implemented with a CMOS inverter, where

FIGS. 4A and 4B are time charts illustrating a data signal and data strobe signals transmitted between the controller and the memory, where

FIGS. 10A to 10D are diagrams illustrating a configuration and operation of a receiving circuit (a receiver) that receives differential data strobe signals in a memory interface circuit of an embodiment, where FIG. 10A illustrates a circuit configuration and FIGS. 10B to 10D illustrate relationships between inputs and outputs in each section.

DESCRIPTION OF EMBODIMENT

Before describing a memory interface circuit of an embodiment, a basic configuration and operation of a memory interface circuit are discussed.

Double data rate (DDR) is a standard for connecting a CPU (controller) to an external memory (dual inline memory module (DIMM)). Standards such as DDR2, DDR3, and DDR4 have been established in accordance with an increase in operation speed.

In DDR2 and DDR3, an interface called Stub-Series Terminated Logic (SSTL) has been employed as an interface form for data transmission. On the other hand, in DDR4, it has been decided to employ an interface called Pseudo Open Drain (POD) as an interface form for data transmission.

Figure 1A:
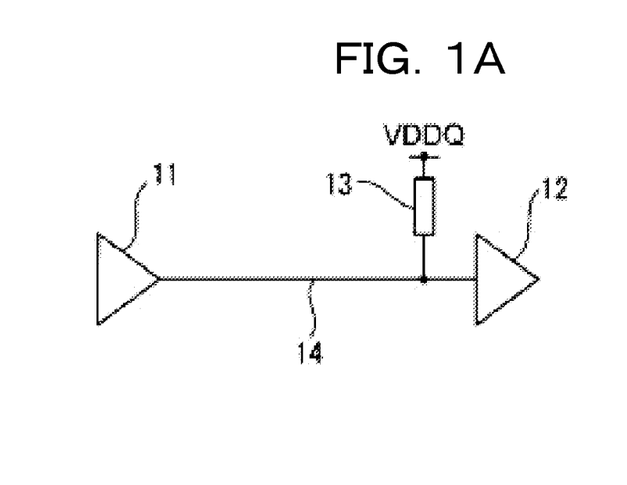
FIGS. 1A to 1D are diagrams illustrating configurations and signals of a communication path section of a POD interface.
Figure 1B:
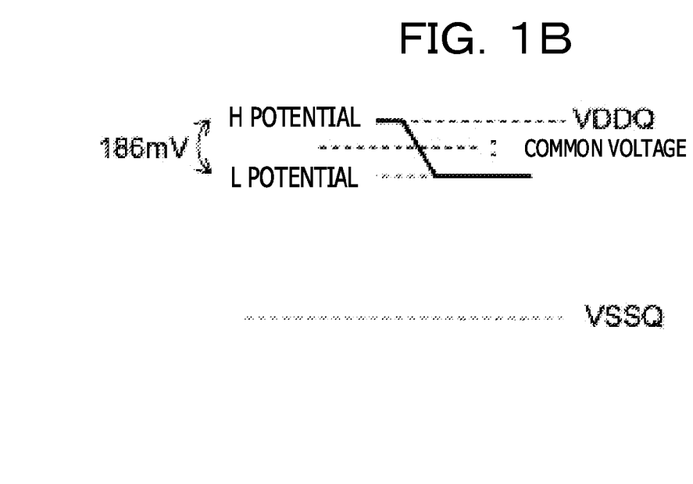
Figure 1C:
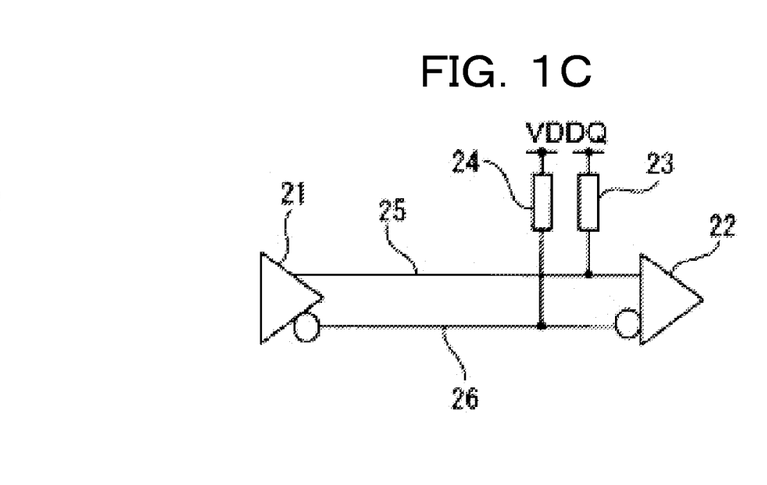
Figure 1D:
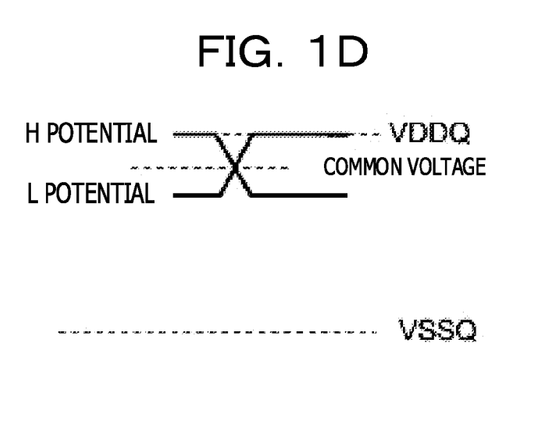

FIGS. 1A to 1D are diagrams illustrating configurations and signals of a communication path section of the POD interface. FIG. 1A illustrates a configuration adapted to transmit a single-ended signal, FIG. 1B illustrates the transmitted single-ended signal, FIG. 1C illustrates a configuration adapted to transmit differential signals, and FIG. 1D illustrates the transmitted differential signals.

Figure 2A:
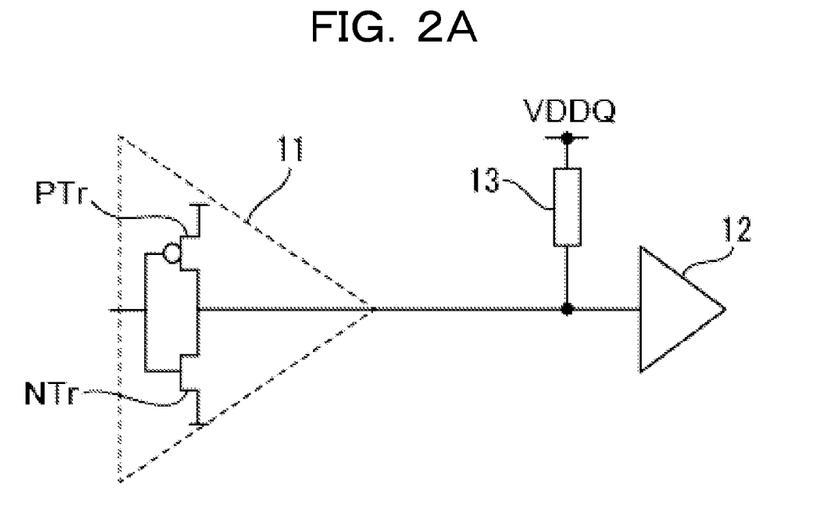
FIG. 2A illustrates a circuit configuration and FIG. 2B illustrates a configuration in which a transistor that forms the CMOS inverter is depicted with impedance components for describing signal potentials.
Figure 2B:
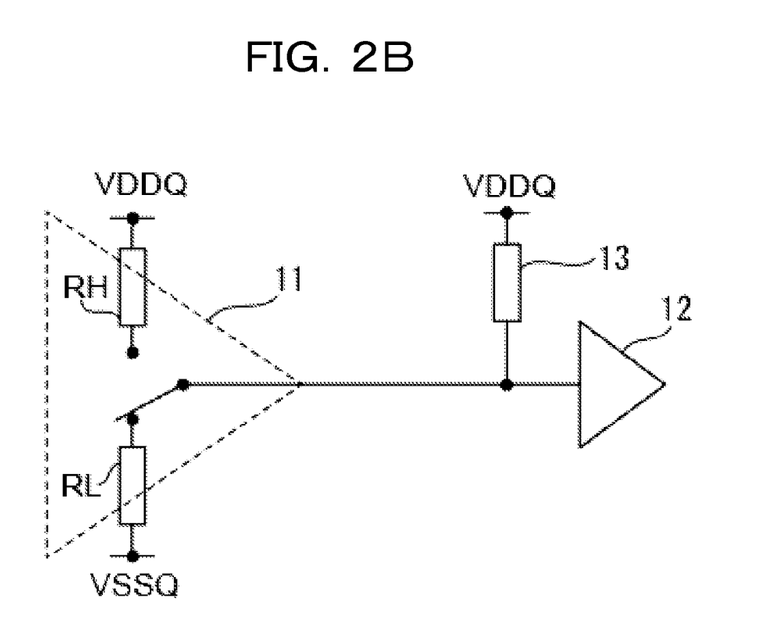

FIGS. 2A and 2B are diagrams illustrating circuit examples in which a driver (an output buffer) is implemented with a CMOS inverter, where FIG. 2A illustrates a circuit configuration and FIG. 2B illustrates a configuration in which a transistor that forms the CMOS inverter is depicted with impedance components for describing signal potentials.

As illustrated in FIG. 1A, the POD interface which transmits a single-ended signal has a driver 11, a receiver 12, a terminal resistor 13, and a transmission line 14. As illustrated in FIG. 2A, the POD interface has a form of connecting the terminal resistor between a signal terminal and a power source for a CMOS output. Thus, as illustrated in FIGS. 2A and 2B, regarding the output voltage (an input voltage) of a transmission signal, High (H) potential corresponds to a power source voltage (VDDQ). Further, Low (L) potential corresponds to a voltage that is obtained by dividing VDDQ by a ratio of an impedance of the terminal resistor 13 and an output impedance RL of an NMOS transistor of the driver 11.

As illustrated in FIG. 1B, a transmission signal is switched between H potential and L potential and, according to DDR4, the range between H potential and L potential is 186 mV and an intermediate level of H potential and L potential corresponds to a common voltage.

As illustrated in FIG. 1C, the POD interface which transmits the differential signals has a driver 21, a receiver 22, terminal resistors 23 and 24, and transmission lines 25 and 26. The terminal resistor 23 is connected between the transmission line 25 and the power source VDDQ, and the terminal resistor 24 is connected between the transmission line 26 and the power source VDDQ. As illustrated in FIG. 1D, the transmission signal is the same as the single-ended signal except that the transmission signal is differential.

In order to realize a transmission speed twice as high as the speed of DDR3, a signal amplitude in DDR4 (186 mV) of transmitted and received signals is smaller than a signal amplitude in DDR3. It is thus desirable that the receiver circuit used in DDR4 be able to process signals whose common voltage range is wide and whose amplitude is small.

Figure 3:
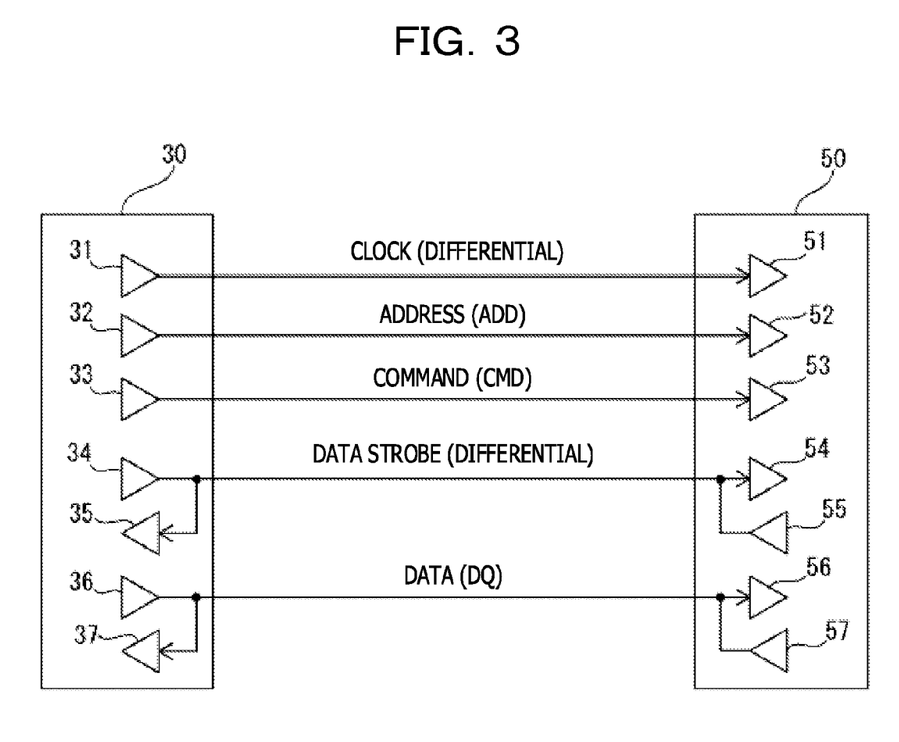
FIG. 3 is a diagram illustrating signals transmitted between a controller and a memory, and a circuit provided to the controller and the memory (DIMM) for transmitting and receiving these signals.

FIG. 3 is a diagram illustrating signals transmitted between a controller and a memory, and a circuit provided to the controller and the memory (DIMM) for transmitting and receiving these signals.

As illustrated in FIG. 3, control signals including differential clock signals (CK), address signals (ADD), and command signals (CMD) are transmitted from a controller 30 to a memory (DIMM) 50. The differential clock signals (CK) are signals by which the controller 30 and the memory (DIMM) 50 are operated in synchronization with each other. The address signal and the command signal are signals by which the controller specifies an operation (write/read) to/from the memory and are uni-directionally transmitted from the controller 30 to the memory (DIMM) 50.

The controller 30 has drivers 31 to 33 that output the differential clock signals, the address signal, and the command signal. The memory (DIMM) 50 has receivers 51 to 53 that receive the differential clock signals, the address signal, and the command signal.

Moreover, in order for the controller 30 to perform writing and reading of data to and from the memory (DIMM) 50, data strobe signals (DQS) and a data signal (DQ) are transmitted and received between the controller and the memory (DIMM). When data is written to the memory (DIMM) 50 (during a write operation), data strobe signals and a data signal are transmitted from the controller 30 to the memory (DIMM) 50. When data is read from the memory (DIMM) 50 (during a read operation), data strobe signals and a data signal are transmitted from the memory (DIMM) 50 to the controller 30. In other words, the data strobe signals and the data signal are signals that are transmitted bi-directionally.

The controller 30 has a driver 34 that transmits data strobe signals, a receiver 35 that receives data strobe signals, a driver 36 that transmits a data signal, and a receiver 37 that receives a data signal. The memory (DIMM) 50 has a receiver 54 that receives data strobe signals, a driver 55 that transmits data strobe signals, a receiver 56 that receives a data signal, and a driver 57 that transmits a data signal. The driver 34 of the controller 30 and the driver 55 of the memory (DIMM) 50 are controlled so that, when one of the drivers 34 or 55 is active (in an on-state), the other thereof is inactive (in an off-state), because simultaneous activation of the drivers 34 and 55 causes a collision of the data strobe signals. Further, if both the driver 34 and the receiver 35 of the controller 30 were to be activated, the receiver 35 would receive the data strobe signals transmitted by the driver 34. In order to avoid such a situation, the driver 34 and the receiver 35 are controlled so as to not be activated at the same time. The driver 55 and the receiver 54 of the memory (DIMM) 50 are controlled in a similar manner. Furthermore, the driver 36 that transmits the data signal (DQ) and the receiver 37 that receives the data signal (DQ) of the controller 30, and the receiver 56 that receives the data signal (DQ) and the driver 57 that transmits the data signal (DQ) of the memory (DIMM) 50, are also controlled in a similar manner.

For example, the controller 30 generates a driver control signal that causes the driver 34 and the driver 36 to be activated in synchronization with an output of a write command signal. Further, the controller 30 generates a receiver control signal that causes the receiver 35 and the receiver 37 to be activated in synchronization with an output of a read command signal.

For example, the memory (DIMM) 50 generates a receiver control signal that causes the receiver 54 and the receiver 56 to be activated in synchronization with reception of a write command signal. Further, the memory (DIMM) 50 generates a driver control signal that causes the driver 55 and the driver 57 to be activated in synchronization with reception of a read command signal.

Figure 4A:
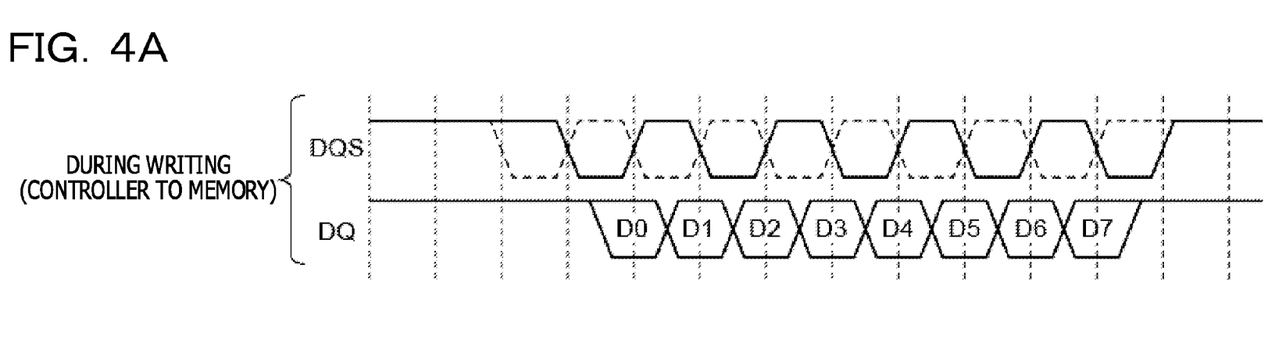
FIG. 4A illustrates signals in a write operation and FIG. 4B illustrates signals in a read operation.
Figure 4B:
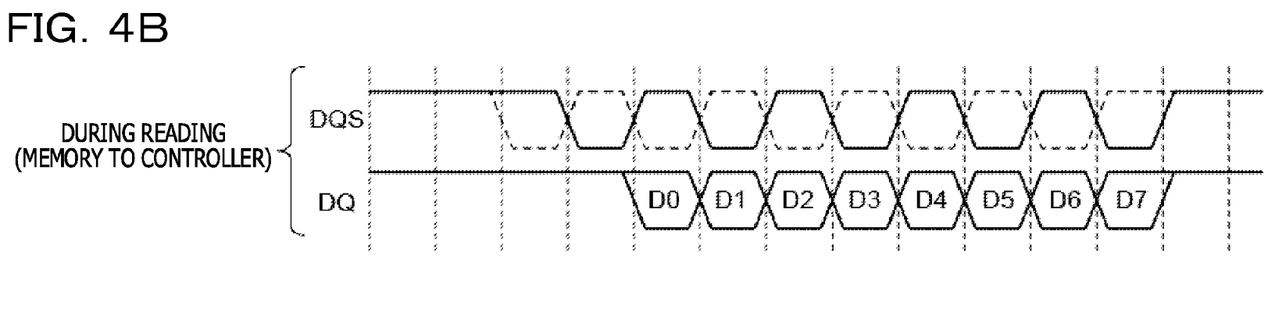

FIGS. 4A and 4B are time charts illustrating a data signal and data strobe signals transmitted between the controller and the memory, where FIG. 4A illustrates signals in a write operation and FIG. 4B illustrates signals in a read operation.

The data strobe signals (DQS) are differential signals and include normal phase DQS_t and inverted phase DQS_c. In FIGS. 4A and 4B, DQS_t is represented by a solid line and DQS_c is represented by a dashed line. For example, as illustrated in FIG. 4A, in a write operation, DQS are outputted from a time of 1.5 cycles before the start of the transmission of DQ to a time of 0.5 cycles after the end of the transmission of DQ. The transition edges of DQS and DQ are shifted by 0.5 cycles from each other. Further, as illustrated in FIG. 4B, in a read operation, DQS are outputted from a time of 2.0 cycles before the start of the transmission of DQ to the end of the transmission of DQ. The transition edges of DQS and DQ are in-phase. Note that the time charts of FIGS. 4A and 4B are an example, and various examples of phase relationships and time periods when DQS are outputted with respect to DQ may be possible as long as DQS and DQ are synchronized with each other.

The logic levels of DQS_t and DQS_c outputted from the DQS drivers 34 and 55 of the controller 30 and the memory (DIMM) 50 are inverted with respect to each other at all times, and the logic values in the receivers 35 and 54 are determined by relative potentials of DQS_t and DQS_c. Specifically, a condition of DQS_t>DQS_c results in "H", a condition of DQS_t<DQS_c results in "L", and a condition of DQS_t=DQS_c results in an undefined state.

The data signal (DQ) is single-ended, and determination of its logic value depends on a potential relative to the common voltage.

During a write operation and a read operation, the receiving side of the data signal (the memory (DIMM) during writing, and the controller during reading) utilizes the data strobe signals (DQS) as a timing reference for the data signal (DQ) to receive data. Specifically, the data signal (DQ) is acquired upon transition of the data strobe signals (DQS) and then incorporated. Alternatively, after phase adjustment of an internal clock is performed by using the data strobe signals (DQS), the data signal (DQ) is acquired by using the internal clock. In the following, a description is provided assuming that DQ is acquired upon transition of DQS after the DQS delay is adjusted.

When not performing writing and reading to and from the memory, the controller 30 and the memory (DIMM) 50 output neither data strobe signals (DQS) nor a data signal (DQ). Thus, in DDR4, both data strobe signals (DQS) and a data signal (DQ) become "H" due to the terminal resistor. In particular, in the data strobe signals (DQS), both DQS_t and DQS_c become "H" and thus the logic value at the receiver is not defined, that is, becomes undefined.

In an undefined state of the data strobe signals (DQS), malfunction is likely to occur when the data signal (DQ) is acquired and transferred inside due to noise and the like. In order to suppress such a situation, the controller and the memory (DIMM) stop operation of the receivers that are used for receiving the data strobe signals (DQS) except at the timing for receiving data by themselves, and apply preventive measures so as to not cause the undefined input to be transferred inside.

As discussed above, in order to suppress a collision of the bi-directionally transmitted data strobe signals (DQS) and data signal (DQ) and suppress an erroneous signal acquisition, the controller 30 and the memory (DIMM) 50 generate a driver control signal and a receiver control signal. It seems to be useful to utilize this receiver control signal to suppress the erroneous data being acquired and transferred inside. As described later, because timing control is difficult when the operation state of the receiver is controlled in a read operation in which data is read from the memory (DIMM) 50, description is provided below for the receiver control signal of the receiver 35 of the controller 30 as an example.

Figure 5:
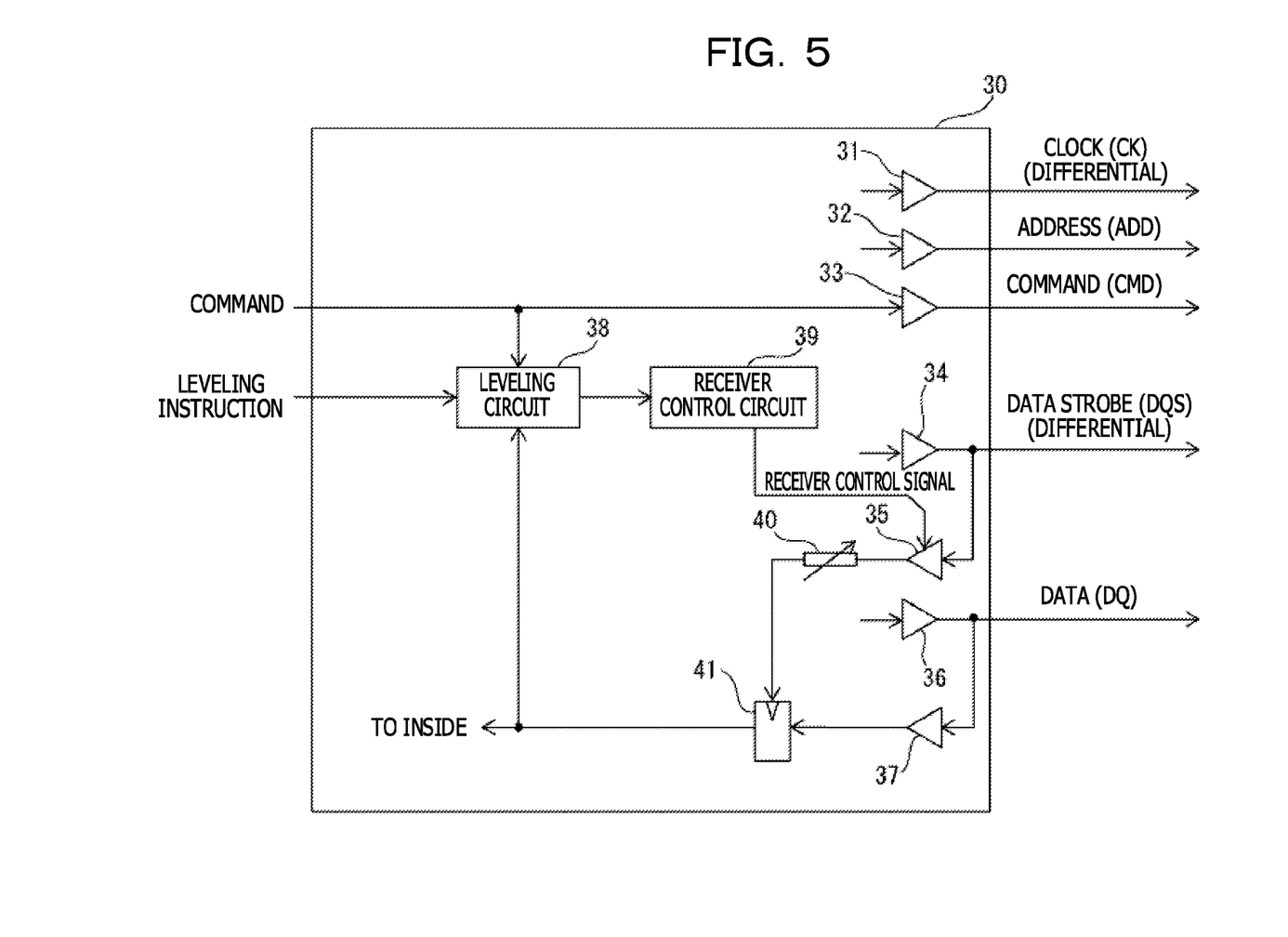
FIG. 5 is a diagram illustrating a configuration of a section related to a memory interface of the controller.

FIG. 5 is a diagram illustrating a configuration of a section related to a memory interface of the controller 30.

As described above, the controller 30 has the drivers 31 to 34 and 36 and the receivers 35 and 37. The controller 30 further has a leveling circuit 38, a receiver control circuit 39, a delay circuit 40, and a latch (or a flip-flop (FF)) 41.

The receiver 35 passes the data strobe signals (DQS) when the receiver control signal outputted from the receiver control circuit 39 is "H", and fixes the output to "H" when the receiver control signal is "L". When writing data to the memory (DIMM) 50, the receiver control circuit 39 sets the receiver control signal to "L" so as to not acquire the data which the controller 30 itself writes, in accordance with whether a write operation or a read operation is indicated by the command signal. When reading data from the DIMM 50, the receiver control circuit 39 sets the receiver control signal to "H".

When data is read from the memory (DIMM) 50, the data strobe signals (DQS) passed by the receiver 35 are applied to a clock terminal of the latch (or FF) 41 via the delay circuit 40. The latch (or FF) 41 utilizes a rising edge and a falling edge of DQS with adjusted delay to acquire the data signal (DQ) passed by the receiver 37.

Figure 6A:
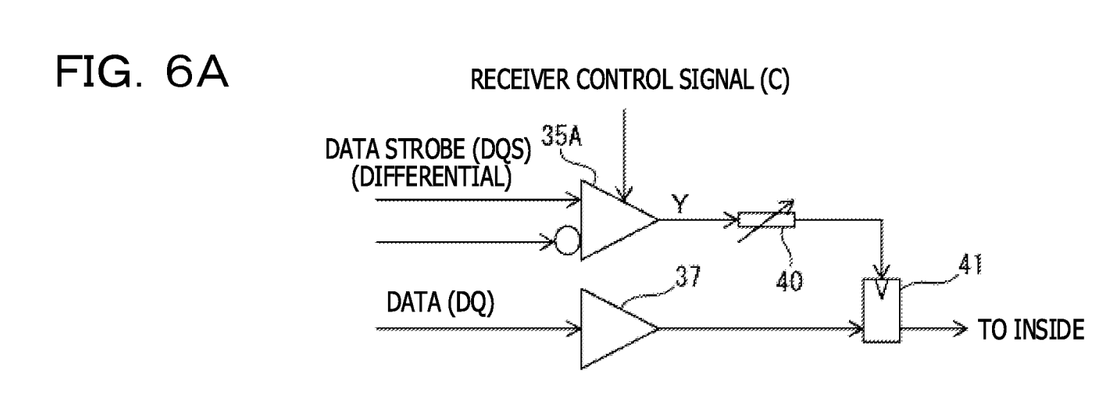
FIG. 6A is a circuit diagram illustrating a section of a receiver which receives differential data strobe signals, a receiver which receives a data signal, a delay circuit, and a latch (or FF)
Figure 6B:
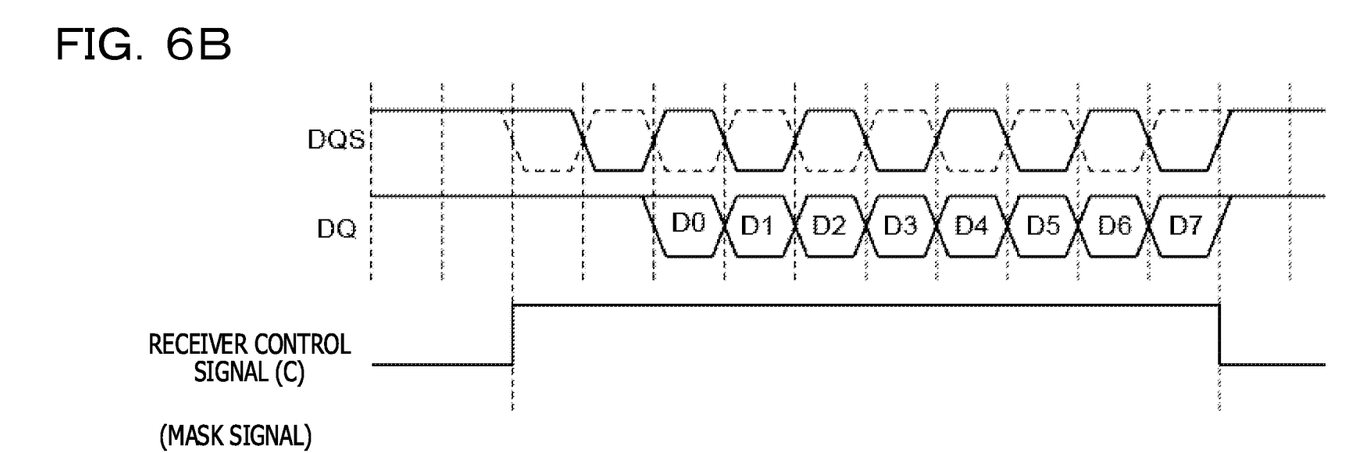
FIG. 6B is a time chart illustrating operation thereof.

FIG. 6A is a circuit diagram illustrating a section of the receiver 35, the receiver 37, the delay circuit 40, and the latch (or FF) 41, and FIG. 6B is a time chart illustrating operation thereof. The circuit diagram of FIG. 6A depicts the receiver 35 so as to clarify that a differential type receiver 35A is employed.

Figure 7:
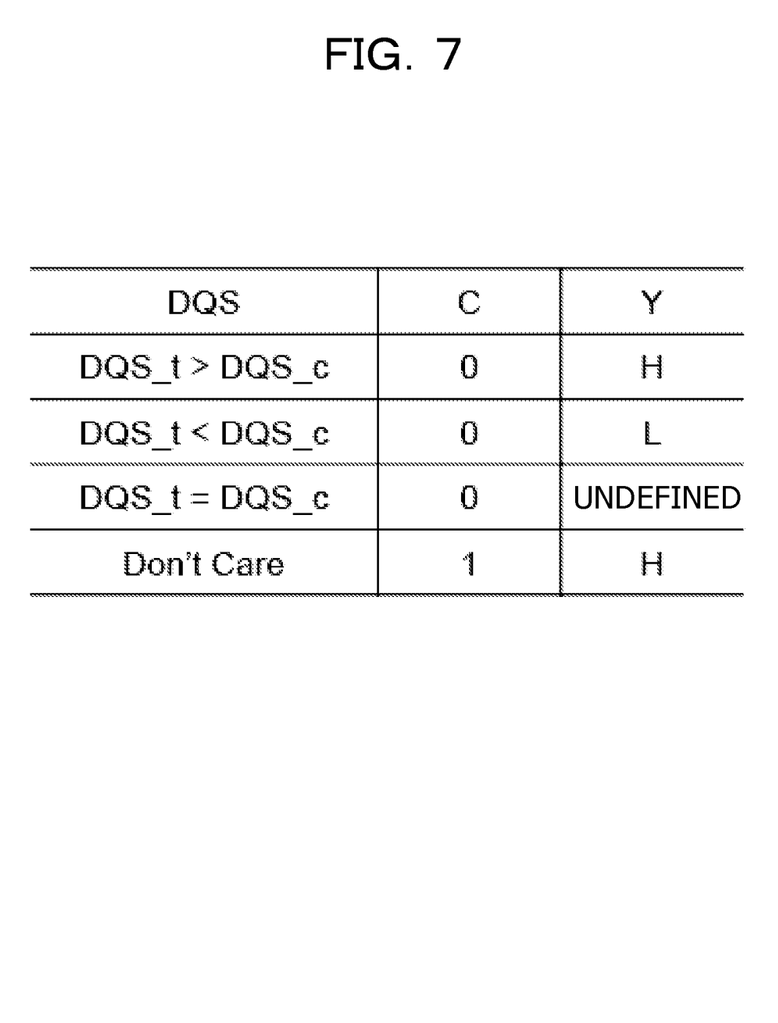
FIG. 7 is a list illustrating output values for inputs at the receiver.

FIG. 7 is a diagram illustrating a value of output Y with respect to inputs (DQS_t and DQS_c, receiver control signal (c)) at the receiver 35A.

When the receiver control signal (c) is "H(1)", output Y at the receiver 35A becomes "H" when DQS_t>DQS_c, becomes "L" when DQS_t<DQS_c, and becomes undefined when DQS_t=DQS_c. Further, when the receiver control signal (c) is "L(0)", output Y at the receiver 35A becomes "H", regardless of the input.

As illustrated in FIG. 6B, the receiver control signal (c) is utilized as a mask signal for controlling the operation state of the receiver 35. It is desired that the period of the receiver control signal (c) being "H" match the receiving timing of the data strobe signals (DQS) inputted to the receiver 35. Specifically, the receiver control signal (c) has to be "H" in the period where DQS_t and DQS_c are signals having an inverse relationship and be "L" in the period where it is not determined which of DQS_t and DQS_c is higher or lower resulting in an undefined state. If the data control signal (c) becomes "H" in the period where the determination of DQS_t and DQS_c is undefined, a value that does not correspond to the data signal (DQ) may be erroneously acquired as data. Further, if the receiver control signal (c) does not become "H" in spite of the fact that the data strobe signals (DQS) have been received, the desired data signal (DQ) may not be acquired.

Referring again to FIG. 5, in order to cause the period of the receiver control signal being "H" to match a receiving timing, the leveling circuit 38 performs leveling. Leveling is a phase adjustment operation for causing the receiver control circuit 39 to change the phase of the receiver control signal while reading known data from the memory (DIMM) 50 and for searching for a timing at which the data actually received by the controller 30 matches the known data. The phase adjustment step at this time is sufficiently shorter than a cycle of the data signal (DQ).

Figure 8:
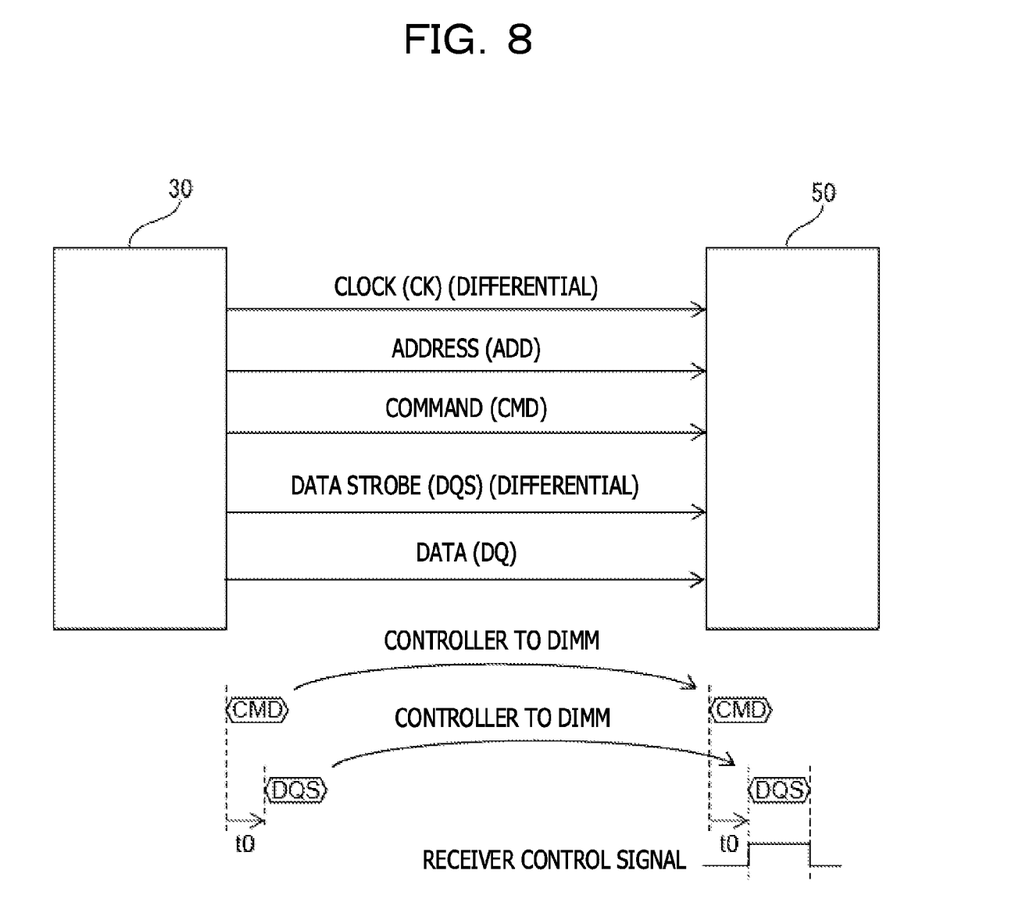
FIG. 8 is a diagram illustrating a timing shift in a write operation of data to the memory (DIMM) from the controller.

FIG. 8 is a diagram illustrating a timing shift in a write operation of data to the memory (DIMM) 50 from the controller 30.

In a write operation of data to the memory (DIMM) 50, the write control signal, the data strobe signals (DQS), and the data signal (DQ) are transmitted in the same direction from the controller 30 to the memory (DIMM) 50. Since a delay inside an LSI that is an intermediate path of signal transmission, a delay in a PCB, and the like are added to all the signals in the same manner, no change occurs in relative delays among the write control signal generated according to a write command (CMD) signal, the data strobe signals (DQS), and the data signal (DQ). Thus, after receiving the write command (CMD) signal from the controller 30, the memory (DIMM) 50 receives the data strobe signals (DQS) and the data signal (DQ) after a predetermined fixed delay. Therefore, based on, for example, the write command (CMD) signal, the memory (DIMM) 50 is able to readily determine a timing for enabling the receiver that receives the data strobe signals (DQS) and thus is able to generate the receiver control signal with accuracy.

Figure 9:
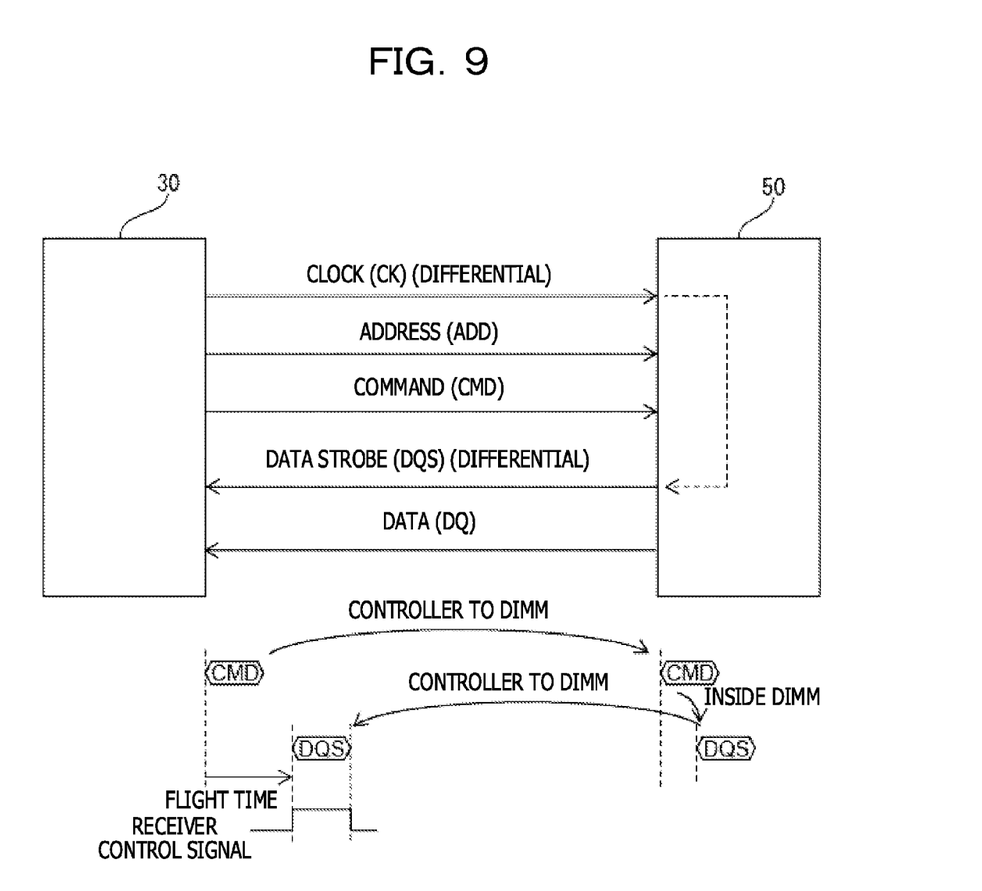
FIG. 9 is a diagram illustrating a timing shift in a read operation of data from the memory (DIMM) by the controller.

FIG. 9 is a diagram illustrating a timing shift in a read operation of data from the memory (DIMM) 50 by the controller 30.

In a read operation of data from the memory (DIMM) 50, the controller 30 transmits a read command (CMD) signal to the memory (DIMM) 50, and the memory (DIMM) 50 reads data from a memory based on the received read command (CMD) signal. The memory (DIMM) 50 then transmits the data strobe signals (DQS) and the data signal (DQ) to the controller 30. For example, the controller 30 generates a receiver control signal that enables the receiver for the data strobe signals (DQS) after a fixed delay from the transmission of the read command (CMD) signal. However, the period from the time when the controller 30 transmits the read command (CMD) signal to the time when the DIMM 50 receives the read command (CMD) signal is different depending on the signal path length from the controller 30 to the memory (DIMM) 50. Further, there is an individual difference regarding the memory (DIMM) 50 in the period from the time of the memory (DIMM) 50 receiving the read command (CMD) signal to the time of reading data. Thus, the period from the time when the controller 30 transmits the read command (CMD) signal to the time when the memory (DIMM) 50 receives the data strobe signals (DQS) and the data signal (DQ) (referred to as flight time) is not fixed and is affected by a difference in delay, implementing location, distance, and so on of the memory (DIMM). Therefore, generating a receiver control signal from the time of transmission of a read command (CMD) signal causes a shift. Note that, since the data strobe signals (DQS) and the data signal (DQ) are the signals transmitted in the same direction, the relative delay between DQS and DQ is substantially fixed.

As described above, a shift between an input timing of the data strobe signals (DQS) and the receiver control signal causes a situation where DQS are not accurately acquired and an undefined determination is outputted or an edge of the desired DQS is not acquired. This problem is made more considerable due to the increased communication speed at a memory interface.

Accordingly, it is difficult to estimate, during shipping and the like in advance, the timing for enabling the receiver. Therefore, training (a timing setting operation) called leveling is performed at appropriate timing, which allows the receiver control signal to be generated at an accurate timing. Leveling is carried out at startup of a device, and re-leveling has to be performed when a device environment (a power supply voltage, an ambient temperature, and the like) significantly changes and the flight time changes accordingly. It is considered that re-leveling is carried out at the following example timings. One example is the time of failure in data reading. Another example is the time when, in monitoring of the phase relationship between the data signal and the data strobe signals, a phase transition exceeding a predetermined amount is detected. Yet another example is the time when a time interval that has been predetermined during design has elapsed regardless of the environment change. In any case, memory access from a user program is disabled during re-leveling.

Moreover, implementing leveling involves a dedicated leveling circuit, which results in a large circuit size and increased cost. Thus, accurate control of the receiver control signal results in an increase in cost and a decrease in execution speed of the program.

Accordingly, it is difficult to accurately control the receiver control signal so as to avoid the situation where the receiver outputs an undefined determination or the desired DQS edge is not acquired.

In an embodiment described below, a receiving circuit that receives differential data strobe signals (DQS) whose output does not become undefined is realized. In the receiving circuit (a receiver) that receives the differential data strobe signals (DQS) of the embodiment, as used in a high speed memory interface circuit such as DDR4, the delay from input to output of DQS is small.

Figure 10A:
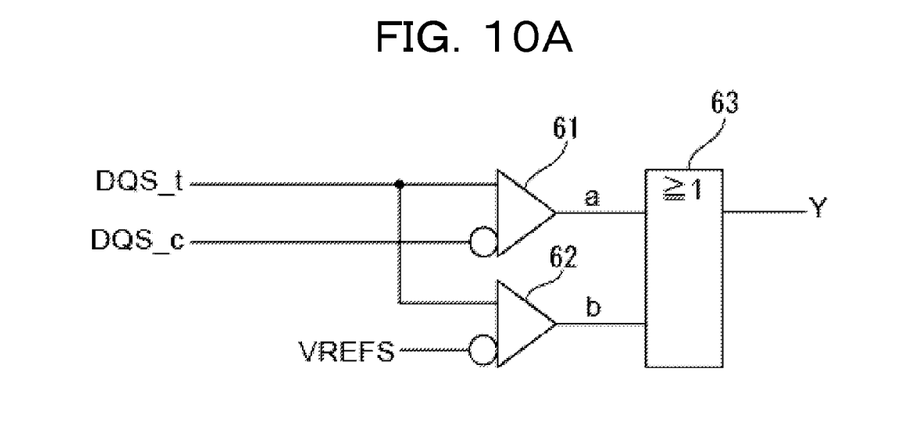
Figure 10B:
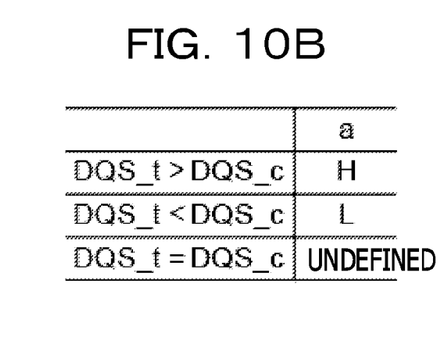
Figure 10C:
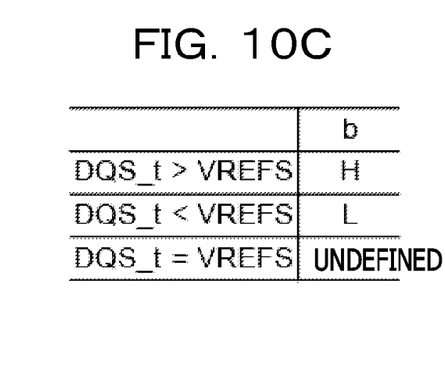
Figure 10D:
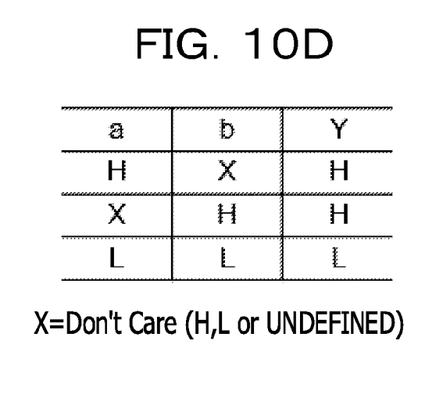

FIGS. 10A to 10D are diagrams illustrating a configuration and operation of a receiving circuit (the receiver) that receives differential data strobe signals (DQS) in a memory interface circuit of the embodiment, where FIG. 10A illustrates a circuit configuration and FIGS. 10B to 10D illustrate relationships between inputs and outputs in each section.

The memory interface circuit of the embodiment has a general configuration as illustrated in FIG. 3, a controller has a configuration as illustrated in FIG. 5, and a receiver 35 that receives the differential data strobe signals (DQS) has a circuit configuration as illustrated in FIG. 10A. Further, a receiver 54 that receives the differential data strobe signals (DQS) of a memory (DIMM) 50 has a circuit configuration as illustrated in FIG. 10A. In the following description, the receivers 35 and 54 are collectively simply referred to as a receiver that receives the differential data strobe signals (DQS).

Note that, as described above, since reception of the differential data strobe signals (DQS) by the receiver 54 is performed after a predetermined time from reception of a command signal, the receiver control signal supplied to the receiver 54 may also control the receiver 54 so as not to cause a malfunction. Thus, the circuit configuration illustrated in FIG. 6, rather than the configuration illustrated in FIG. 10A, may be applied to the receiver 54 of the memory (DIMM) 50.

As illustrated in FIG. 10A, the receiver that receives the differential data strobe signals (DQS) in the memory interface circuit of the embodiment has a primary receiver 61, a secondary receiver 62, and a determination circuit 63. The primary receiver 61 and the secondary receiver 62 are implemented with a differential amplifier circuit. The determination circuit 63 is implemented with an OR gate.

The primary receiver 61 compares a normal phase signal DQS_t to an inverted phase signal DQS_c of the differential data strobe signals (DQS). As illustrated in FIG. 10B, output a of the primary receiver 61 becomes "H" when DQS_t>DQS_c, becomes "L" when DQS_t<DQS_c, and becomes undefined when DQS_t=DQS_c.

The secondary receiver 62 compares a normal phase signal DQS_t of the differential data strobe signals (DQS) to a strobe reference voltage VREFS. The strobe reference voltage VREFS is set to a voltage higher than the common voltage and slightly lower than VDDQ. As illustrated in FIG. 10C, output b of the secondary receiver 62 becomes "H" when DQS_t>VREFS, becomes "L" when DQS_t<VREFS, and becomes undefined when DQS_t=VREFS.

The determination circuit 63 outputs a logical OR of the primary receiver 61 and the output of the secondary receiver 62. Therefore, as illustrated in FIG. 10D, output Y of the determination circuit 63 becomes "H" when at least one of a or b is "H" and becomes "L" when both of a and b are "L".

Figure 11:
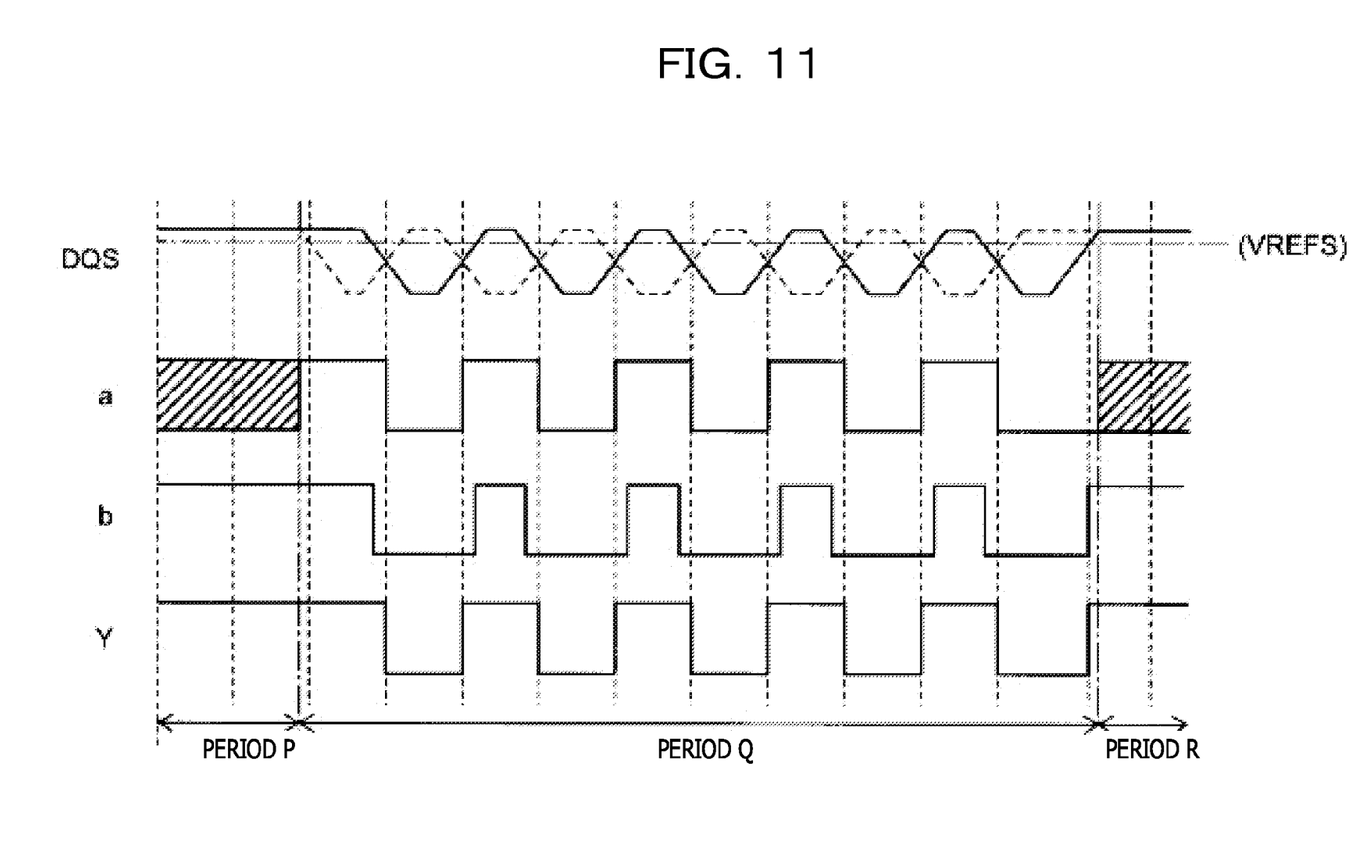
FIG. 11 is a time chart illustrating an example of the differential data strobe signals and corresponding transitions in outputs of a primary receiver, a secondary receiver, and a determination circuit.

FIG. 11 is a time chart illustrating an example of change in the differential data strobe signals (DQS) and transitions in response thereto in outputs a, b, and Y of the primary receiver 61, the secondary receiver 62, and the determination circuit 63.

Before transmission of the differential data strobe signals (DQS) from the transmission side is started (period P), the condition of DQS_t=DQS_c=VDDQ ("H" level) is established. At this time, a is undefined, and b and Y are "H".

A period from the start to the end of the transmission of DQS is period Q. In period Q, once the transmission of DQS is started, DQS_c starts changing to "L" and, after some time elapses, DQS_t and DQS_c are switched between "H" and "L" for every cycle as inverse signals. Immediately after the start of the change, output a of the primary receiver 61 switches to "H" from an undefined state because of the condition of DQS_t>DQS_c and, after approximately one cycle elapses, switches to "L" because of the condition of DQS_t<DQS_c. Then, while DQS is being transmitted, output a repeats a transition between "H" and "L" for every cycle.

At the end of the transmission of DQS, while DQS_t changes from "L" to "H", DQS_c is maintained as "H", so that output a is "L" until DQS_t switches to "H" and becomes undefined in response to DQS_t switching to "H". In such a way, in the period R after the end of the transmission of DQS, output a becomes undefined.

As depicted in FIG. 11, the strobe reference voltage VREFS is set to a voltage slightly lower than VDDQ and, after approximately one cycle elapses from the start of the DQS change, DQS_t starts changing to "L" level and the condition of DQS_t<VREFS is established, so that output b switches to "L". As depicted in FIG. 11, while DQS is being transmitted, output b repeats the transition whose period of the "L" level is slightly longer than that of output a. At the end of the transmission of DQS, output b switches to "H" before output a becomes undefined.

Output Y is the logical OR of output a and output b and switches in the same manner as output a except that output Y switches to "H" in response to output b switching to "H" at the end of the transmission of DQS.

As illustrated in FIG. 11, in output Y of the receiver that receives the differential data strobe signals (DQS) in the memory interface circuit of the embodiment, the output value is defined at all times and does not become undefined. Therefore, the problem of an acquisition of an erroneous data signal (DQ) due to an undefined output of the receiver does not occur.

Note that, the memory interface circuit of the embodiment is also configured so that the receiver 35 does not acquire the differential data strobe signals (DQS) outputted by the driver 34 of the controller 30 when writing data to the memory (DIMM) 50. Thus, a receiver control circuit 39 is provided to generate a receiver control signal to control the operation state of the receiver 35. Since the value of output Y of the receiver 35 of the embodiment is defined at all times, accurate control of the receiver control signal is unnecessary and no problem occurs even when the receiver signal is generated from the time of output of a command signal. This is the same for the receiver 54 of the memory (DIMM) 50 that receives the differential data strobe signals (DQS).

As illustrated in FIG. 10A, in the receiver that receives the differential data strobe signals (DQS) in the memory interface circuit of the embodiment, the number of circuit components is small, each component is of a simple circuit, and the circuit is compact. Moreover, the primary receiver and the secondary receiver may be formed of the same circuit, which is less likely to cause a difference in delay. Moreover, the determination circuit merely outputs a logical OR, which allows for a simple circuit and slight delay. Therefore, a larger temporal margin is allowed when the data signal (DQ) is acquired upon the receiver output.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A receiving circuit that receives differential data strobe signals between a controller and a memory, the receiving circuit comprising:
    a first receiver that compares a normal phase signal of the differential data strobe signals to an inverted phase signal of the differential data strobe signals, outputs a high logic value when the normal phase signal is higher than the inverted phase signal, outputs a low logic value when the normal phase signal is lower than the inverted phase signal, and output a value that is different from the high logic value or the low logic value when the normal phase signal is equal to the inverted phase signal;
    a second receiver that compares the normal phase signal of the differential data strobe signals to a strobe reference voltage, outputs a high logic value when the normal phase signal is higher than the strobe reference voltage, outputs a low logic value when the normal phase signal is lower than the strobe reference voltage, and outputs a value that is different from the high logic value or the low logic value when the normal phase signal is equal to the strobe reference voltage; and
    a determination circuit that outputs a logical OR of an output of the first receiver and an output of the second receiver.

2. The receiving circuit according to claim 1, wherein the strobe reference voltage is set to any voltage between a common voltage of the differential data strobe signals and a power source voltage.

3. The receiving circuit according to claim 1, wherein the strobe reference voltage is set to a value obtained by subtracting a common voltage of the differential data strobe signals from a power source voltage, multiplying the subtracted value by 0.75, and adding the common voltage to the multiplied value.

4. A memory interface circuit comprising:
    a controller; and
    a memory,
    wherein, when the controller performs writing of data to the memory, the controller outputs writing data to the memory in synchronization with differential data strobe signals,
    wherein, when the controller performs reading of data from the memory, the memory responds to a command signal from the controller and outputs reading data to the controller in synchronization with differential data strobe signals,
    wherein the controller includes
        a first differential data strobe signal receiving circuit that receives the differential data strobe signals from the memory, and
        a first data receiving circuit that acquires data in synchronization with an output of the first differential data strobe signal receiving circuit,
    wherein the first differential data strobe signal receiving circuit includes
        a first first-receiver that compares one of the differential data strobe signals to the other, outputs a high logic value when the one of the differential data strobe signals is higher than the other, outputs a low logic value when the one of the differential data strobe signals is lower than the other, and outputs a value that is different from the high logic value or the low logic value when the one of the differential data strobe signals is equal to the other,
        a first second-receiver that compares one of the differential data strobe signals to a strobe reference voltage, outputs a high logic value when the one of the differential data strobe signals is higher than the strobe reference voltage, outputs a low logic value when the one of the differential data strobe signals is lower than the strobe reference voltage, and outputs a value that is different from the high logic value or the low logic value when the one of the differential data strobe signals is equal to the strobe reference voltage; and
    a first determination circuit that outputs a logical OR of an output of the first first-receiver and an output of the first second-receiver.

5. The memory interface circuit according to claim 4, wherein the strobe reference voltage is set to any voltage between a common voltage of the differential data strobe signals and a power source voltage.

6. The memory interface circuit according to claim 4, wherein the strobe reference voltage is set to a value obtained by subtracting a common voltage of the differential data strobe signals from a power source voltage, multiplying the subtracted value by 0.75, and adding the common voltage to the multiplied value.

7. The memory interface circuit according to claim 4, wherein the memory includes
    a second differential data strobe signal receiving circuit that receives the differential data strobe signals from the controller, and
    a second data receiving circuit that acquires data in synchronization with an output of the second differential data strobe signal receiving circuit,
    wherein the second differential data strobe signal receiving circuit includes
        a second first-receiver that compares one of the differential data strobe signals to the other, outputs a high logic value when the one of the differential data strobe signals is higher than the other, outputs a low logic value when the one of the differential data strobe signals is lower than the other, and outputs a value that is different from the high logic value or the low logic value when the one of the differential data strobe signals is equal to the other,
        a second second-receiver that compares one of the differential data strobe signals to a strobe reference voltage, outputs a high logic value when the one of the differential data strobe signals is higher than the strobe reference voltage, outputs a low logic value when the one of the differential data strobe signals is lower than the strobe reference voltage, and outputs a value that is different from the high logic value or the low logic value when the one of the differential data strobe signals is equal to the strobe reference voltage; and a second determination circuit that outputs a logical OR of an output of the second first-receiver and an output of the second second-receiver.

8. The memory interface circuit according to claim 7, wherein the strobe reference voltage is set to any voltage between a common voltage of the differential data strobe signals and a power source voltage.

9. The memory interface circuit according to claim 7, wherein the strobe reference voltage is set to a value obtained by subtracting a common voltage of the differential data strobe signals from a power source voltage, multiplying the subtracted value by 0.75, and adding the common voltage to the multiplied value.

10. The memory interface circuit according to claim 7, wherein the controller and the memory have a receiver control circuit that generates a receiver control signal that controls operation states of the first differential data strobe signal receiving circuit and the second differential data strobe signal receiving circuit.

11. A receiving method for receiving data transmitted in synchronization with differential data strobe signals between a controller and a memory, the receiving method comprising:

performing first comparison of one of the differential data strobe signals to the other, outputting a high logic value when the one of the differential data strobe signals is higher than the other, outputting a low logic value when the one of the differential data strobe signals is lower than the other, and outputting a value that is different from the high logic value or the low logic value when the one of the differential data strobe signals is equal to the other;

performing second comparison of one of the differential data strobe signals to a strobe reference voltage, outputting a high logic value when the one of the differential data strobe signals is higher than the strobe reference voltage, outputting a low logic value when the one of the differential data strobe signals is lower than the strobe reference voltage, and outputting a value that is different from the high logic value or the low logic value when the one of the differential data strobe signals is equal to the strobe reference voltage;

outputting a logical sum of a result of the first comparison and a result of the second comparison; and receiving the data in synchronization with a transition of the logical OR.

* * * * *